United States Patent [19]

Streifer et al.

[11] Patent Number: 4,972,427
[45] Date of Patent: Nov. 20, 1990

[54] TALBOT CAVITY DIODE LASER WITH UNIFORM SINGLE-MODE OUTPUT

[75] Inventors: William Streifer; Robert G. Waarts, both Palo Alto; David F. Welch; Donald R. Scifres, both of San Jose, all of Calif.

[73] Assignee: Spectra Diode Laboratories, Inc., San Jose, Calif.

[21] Appl. No.: 407,206

[22] Filed: Sep. 14, 1989

[51] Int. Cl.$^5$ ............................................... H01S 3/05
[52] U.S. Cl. ...................................... 372/92; 372/50; 372/99
[58] Field of Search .................... 372/50, 92, 99, 19, 372/49

[56] References Cited

U.S. PATENT DOCUMENTS 4,868,839  9/1989  Simmons et al. .................... 372/92

OTHER PUBLICATIONS

James R. Leger, et al., "Coherent Addition of AlGaAs Lasers Using Microlenses and Diffractive Coupling", *Applied Physics Letters* 52 (21), 23 May 1988. pp. 1771–1773.

A. A. Golubentsev, et al., "Theory of Phase Locking of an Array of Lasers", *Sov. Phys. JETP* 66, (4), Oct. 1987, pp. 676–682.

John T. Winthrop, et al., "Theory of Fresnel Images. I. Plane Periodic Objects in Monochromatic Light", *Journal of the Optical Society of America*, vol. 55, No. 4, Apr. 1965, pp. 373–381.

*Primary Examiner*—James W. Davie
*Attorney, Agent, or Firm*—Thomas Schneck

[57] ABSTRACT

A diode laser of the type having an array of laser emitters in a Talbot cavity in which edge reflectors are added to enhance feedback to edgemost emitters. In one embodiment, a transparent slab with reflectively coated sides is present between the phase plane of the emitted light and the Talbot cavity reflector. The phase plne is defined by a lenticular array placed a focal length in front of the laser emitters. In another embodiment, the Talbot cavity reflector has an increased reflectivity toward its edges. In all embodiments the Talbot cavity reflector is preferably spaced a distance $na^2/\lambda$ from the phase plane, where n is a positive integer, a is separation between adjacent emitters and $\lambda$ is the wavelength of emitted light. An integrated embodiment has the array and cavity reflectors defined ina single semiconductor body divided into active and ransparent region. Side mirrors are etched into the semiconductor body. The laser array may also be extended to two dimensions with individual lasers or laser bars fiber coupled to a lens surface, with an edge reflector and Talbot cavity reflector coated on an otherwise transparent slab.

27 Claims, 8 Drawing Sheets

ARRAY OR SAMPLING FUNCTION

FIG._10A

SINGLE EMITTER PATTERN

FIG._10B

RADIATION PATTERN

TALBOT CAVITY DIODE LASER WITH UNIFORM SINGLE-MODE OUTPUT

DESCRIPTION

1. Technical Field

The present invention relates to semiconductor diode lasers and monolithic integrated arrays of lasers, and in particular to lasers having resonant cavities constructed for providing a diffraction-limited, singlelobe far field beam.

2. Background Art

It is desirable to fabricate a high power semiconductor laser array with good beam quality. Preferred is a beam with a coherent, diffraction limited, single lobe far field, operating in a single spatial and temporal mode, free from astigmatism with a low aspect ratio. The laser should have a low threshold and high overall efficiency and should be capable of being modulated at a high rate. A laser which is also compact and robust is also advantageous. Monolithic integrated arrays of semiconductor lasers or "laser bars" typically have some but not all of the above noted features. Some laser bars with closely spaced, phase-coupled waveguides are capable of producing stable good quality beams, but are limited in their power output due to problems with thermal dissipation. Other laser bars are capable of power outputs greater than 50 watts CW, but because the arrays of lasing elements are uncoupled, they tend to produce a beam output quality which is characteristic of only a single emitter.

One attempt to create a coherent diode laser array with higher power has employed laser bars in an external Talbot cavity. Talbot cavities rely on the phenomenon that an infinite one-dimensional array of identical optical emitters with center-to-center spacing "a" reimages itself at a distance $Z_T = 2a^2/\lambda$ or any integer multiple thereof, where $\lambda$ is the wavelength of the emitted light. Placing a reflector at one-half the Talbot distance, $Z_T/2$, or integral multiples thereof, causes the emitters to reimage back upon themselves. Thus, this configuration can serve as the basis for a laser cavity. The power from each emitter couples into its neighbors by diffraction during the propagation and reflection process, so the array locks coherently. The waveguides in a laser bar need not be closely spaced anymore to produce phase coupling, so higher power outputs can be produced. In-phase emitters reimage on the reflector at distance $Z_T/2$, but laterally shifted by a/2. Thus, a partial reflector at $Z_T/2$ can function as the laser's output element and selectively enhance the in-phase mode.

Even if Talbot reflectors are not placed at the planes defined above, feedback for lasing in selected modes can still be obtained. This may still represent a useful mode of operation. However, in this case the reimaging is not perfect and will result in some increase in threshold and loss in efficiency. This has been described by J. Leger in *Appl. Phys. Lett.* 55(4), 24 July 1989, pages 334–336.

Unfortunately, Talbot cavity lasers produced to date have not been entirely successful. One problem has been poor mode discrimination. While the preferred inphase array mode is dominant, it is not much more so than the other array modes. Another problem results from the fact that the laser bars are not infinite in length but have only a finite number of emitters. Accordingly, the envelope of model amplitudes is not uniform, but sinusoidal, so that non-uniform gain saturation occurs. The residual gain allows other modes to attain threshold. Thus, Talbot cavity lasers have not so far achieved good beam quality.

An object of the invention is to provide a diode laser that produces a coherent, high power diffraction limited beam with a single lobe far field pattern.

Another object of the invention is to provide a diode laser in a Talbot type cavity which has a uniform gain distribution and good mode discrimination.

DISCLOSURE OF THE INVENTION

The above objects have been met with a diode laser having an array of laser emitters in a Talbot resonant cavity in which edge reflectors are added to the cavity. In a principal embodiment, the edge reflectors are side mirrors that effectively image the finite array to infinity, thereby causing the real laser to act like the ideal model of an infinite number of identical emitters in a Talbot cavity. Power from the diverging emitter light that was previously lost at the edges is now reflected back toward the center and so is available to be coupled back into the array. The array elements thus have uniform gain in the preferred array mode. In a second embodiment, the edge reflectors are defined by an increase in reflectivity at or toward the edges of the Talbot reflector itself, thereby increasing the feedback to the edge emitters. The Talbot cavity may either be an external cavity or monolithically integrated into the semiconductor body that forms the array of laser emitters. The array can be a linear array or a two-dimensional array of laser emitters fiber coupled into a transparent cylindrical rod with the Talbot reflector on one end.

Briefly, diode lasers of the present invention comprise a monolithic array of light emitting elements, which generally are defined by an active region with a plurality of waveguides in a semiconductor body. The waveguides terminate in a light emitting plane, which in the external cavity embodiments is an antireflection coated face of the semiconductor body, and in the integrated cavity embodiments is a planar boundary between active and transparent regions of the semiconductor body. The lasers also include a pair of reflectors, one of which usually being defined by a back face of the semiconductor body and the other Talbot reflector is spaced in front of the light emitting plane. For optimum self-imaging and maximum reflection, the front Talbot reflector is preferably placed at a distance of approximately $na^2/\lambda$ from a phase plane of emitted light at or in the space beyond the light emitting plane. In the latter case, a lenticular array is spaced a focal length beyond the light emitting plane, and the phase plane is in the plane of the lens array. Here "n" is a positive integer, "a" is the separation between light emitters, and $\lambda$ is the wavelength of the emitted light in the space between the light emitting plane and the Talbot reflector. As already noted above, the Talbot reflector includes edge reflectors which can be side mirrors or increased edge reflectivity. In order to further improve mode discrimination, the Talbot reflector can also function as a spatial filter that preferentially feeds back the desired array mode.

BEST MODE FOR CARRYING OUT THE INVENTION

Figure 1:
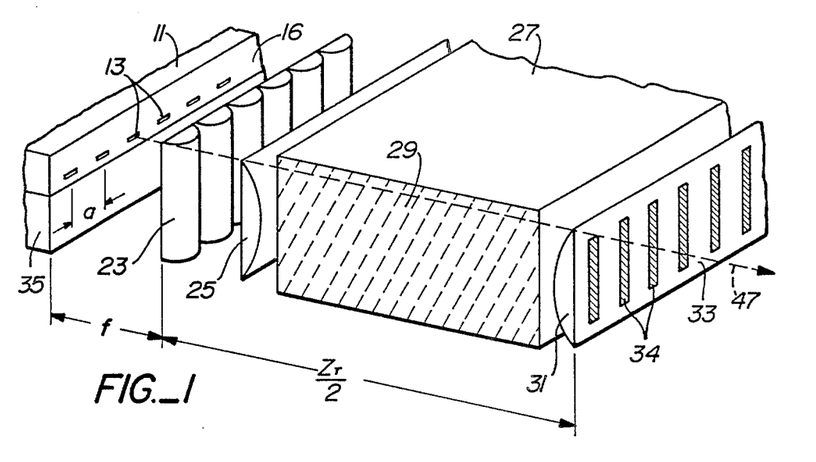
FIG. 1 is a perspective view of a first laser embodiment of the present invention.
Figure 2:
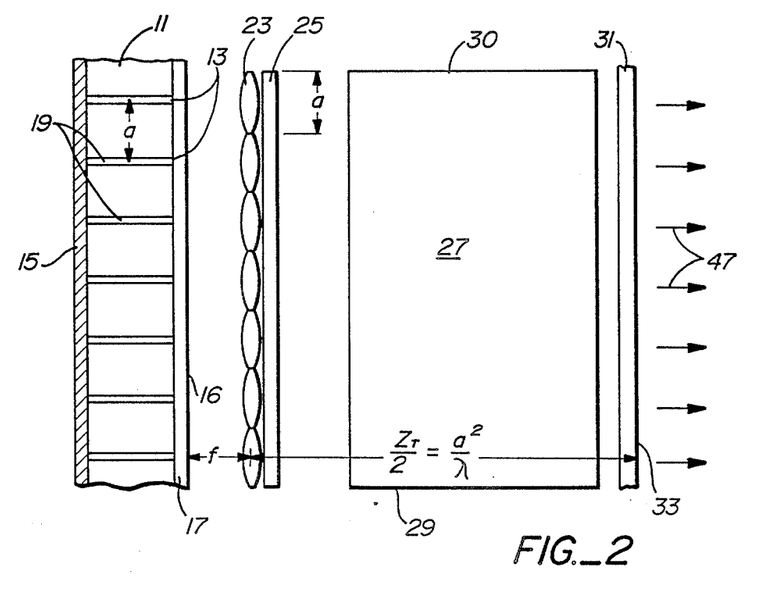
FIG. 2 is a top plan view of the laser in FIG. 1.
Figure 3:
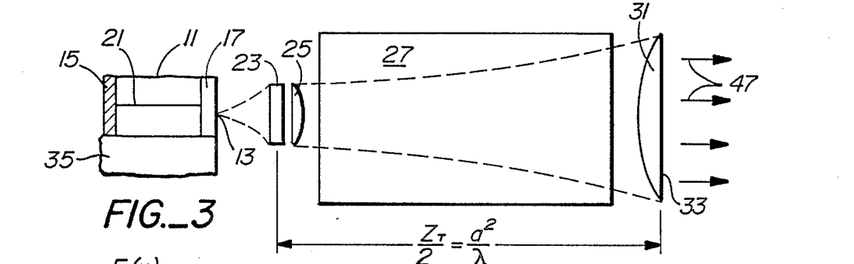
FIG. 3 is a side plan view of the laser in FIG. 1.

With reference to FIGS. 1–3, a laser of the present invention includes a monolithic linear array 11 of laser emitters 13, hereafter referred to as a laser bar 11. Laser bar 11 has a high reflectivity coating 15 on a back face and an antireflection coating 17 on a front emitting face 16. The laser emitters 13 are defined by waveguides 19 communicating optically with an active light emitting region associated with a p-n junction 21. Waveguides 19 at the emitting face 16, and therefore laser emitters 13 are spaced apart by a substantially equal distance a. The laser also includes a lateral lenticular cylindrical lens array 23 and a vertical cylindrical collection lens 25 positioned in front of the emitters 13. Lens array 23 has one lens for each emitter 13, each of width a, and is located a focal length f from the emitting face 16. Vertical lens 25 is closely spaced with or may be integral with lens array 23. A glass slab 27 is disposed in the laser beyond the lenses 23 and 25 and has side mirrors 29 and 30. A vertical cylindrical reflector lens 31, having a front planar surface coated with a pattern 33 of partially reflective stripes, is disposed in front of the slab 27.

The laser bar 11 is preferably a monolithic array with ten or more uncoupled single mode, real-refractive-index waveguide laser elements 13. For example, the Spectra Diode Laboratories 5410 laser bar has 100 mW cW lasers with emission spot radii approximately 0.8 μm by 1.8 μm (Gaussian beam waists) and divergences of 10° laterally and 22° vertically (full width half maximum). The waveguided emitter elements are on 100 μm centers and are optically uncoupled. Coherent bars are not available. The emitter outputs remain single mode up to approximately 150 mW and are relatively insensitive to mode hops. The laser operates reliably for over 10,000 hours without active cooling and has an electrical-to-optical conversion efficiency of as much as 60%.

The manufacture of this and similar laser devices is fully described in the literature of the art.

The laser bar 11 has facet coatings 15 and 17. Typically, back coating 15 is a high reflection coating with over 95% power reflectivity. The front emitting face coating 17 is an anti-reflection coating with 2% or lower power reflectivity. Materials, such as $Al_2O_3$ and $ZrO_2$, may be deposited, and device characteristics monitored during deposition to provide optimal coating thicknesses.

The laser bar 11 is mounted top down on a heatsink 35 for uniform temperature. Minimizing temperature variations in the array are important, because temperature differences may cause individual emitters in the array to lase at different wavelengths, thresholds and efficiencies. Preferably, the power dissipation of the heatsink should be at least 1 W/mm. Active cooling of the heatsink 35 is not required.

The lateral lenticular array 23 consists of individual lenses, one for each emitter 13. Each lens in array 23 collects the light from its corresponding emitter and collimates it in the lateral direction. Alternatively, from the viewpoint of phase, each lens converts the wavefront in the lateral direction, which has been curved in propagating from the laser bar 11, into a planar front. The lens array 23 should collect virtually all (at least 95%) of the light emitted by each emitter 13 with a 10° divergence.

Several suitable fabrication techniques for lens array 23 are known in the lens art, and their product is commercially available from several sources. One type of lens array is a diffused lens type which is fabricated by the electric-field-assisted exchanging of sodium ions in a glass with diffused silver ions, through small slits or openings in a mask, thereby increasing the index of refraction in the neighborhood of the openings, producing graded index (GRIN) lenses. Another lens array type is a plurality of discrete lenses made by grinding, molding pressing, casting or machining. A third lenticular array type employs binary optical elements, such as holographic lenses or discrete Fresnel lenses. Such arrays may be produced directly with a scanning e-beam or made in quantity from a sub-micron photolithography defined mask, and etching. Anti-reflection films may be deposited on discrete and diffused lenses, and on the flat surface of binary lenses, but cannot be coated on the relief surface of binary lenses without distorting their behavior.

Figure 8:
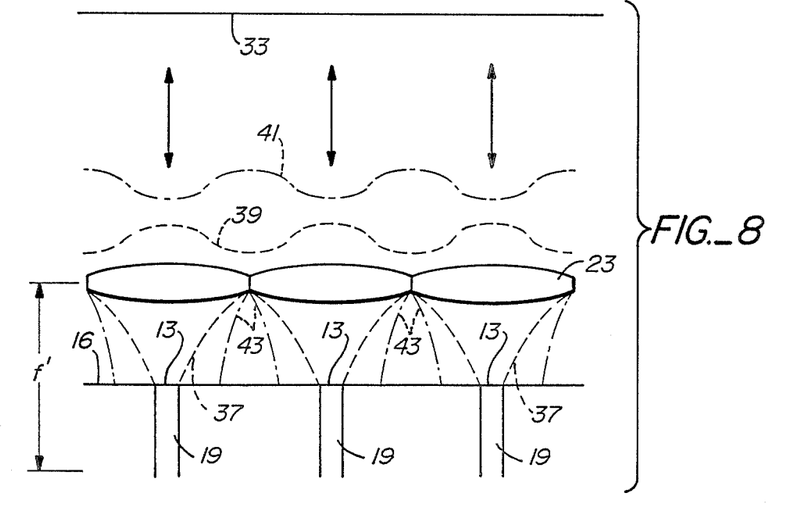
FIGS. 8 and 9 are partial top plan views of the laser in FIG. 1, illustrating positioning of the lenticular array.
Figure 9:
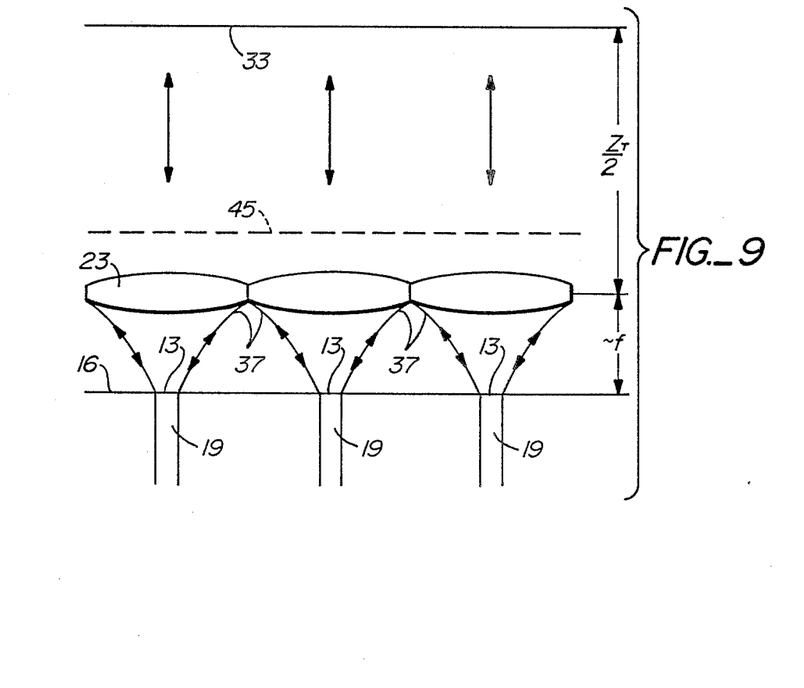

Referring to FIGS. 8 and 9, the lens array 23 should be positioned to pass a planar phase front therethrough. If the focal length f of the lens array is longer than the distance between the array and the emitting phase 16, as in FIG. 8, then the diverging light 37 from emitters 13 will leave the lens array 23 with a curved wavefront 39. After propagation to and from the reflector 33, the phase fronts 41 would return to the lenses with the reverse curvature. Under this condition, the light 43 passing through the lens array 23 would only weakly couple into the waveguides 19. If, however, the lenticular array 23 is located at approximately their focal distance f to the emitters 13, as in FIG. 9, the beams 37 from the emitters 13 are collimated to generate a planar phase front 45. Upon reflection, the light returning from the reflector 33 will also have a planar phase front. It will therefore be efficiently coupled back into the waveguides 19 and the Talbot cavity will be very efficient.

Referring again to FIGS. 1–3, the collection lens 25 and reflector lens 31 are chosen together to produce a laser output 47 which is stigmatic and has a 1:1 aspect ratio. The first requirement is met when the wavefront at the reflector pattern 33 in the vertical direction has a planar wavefront. The second requirement is met by expanding the vertical width of the emitted light until the lateral and vertical extent of the output light 47 are comparable. The vertical cylindrical collection lens 25 is positioned so its focal length is longer than its distance from emitters 13. Thus, the beam 49 continues to diverge after passing through lens 25. After propagating over half the Talbot distance $Z_T/2 = a^2/\lambda$, it will have expanded to a full width of about 850–1000 μm (at $e^{-4}$ of peak intensity). The optical requirements of lens 25 follow from Gaussian beam theory, which is well known in the art. Focal lengths in the range from 200–400 μm are typical for collection lens 25, and distances from emitters 13 range from 150–350 μm. The divergence results in a cylindrical phase front at cylindrical reflector lens 31. Lens 31 collimates the light and directs it at the partial reflector 33. Typically, focal lengths for lens 31 range from 1.4 to 2.2 cm. If an integer multiple of $Z_T/2$ is used for the Talbot reflector distance, the focal length of collector lens 25 must be increased accordingly (along with that of reflector lens 31) to maintain a 1:1 aspect ratio and a planar wavefront output.

Collection lens 25 is shown as a discrete element. Alternatively, the lateral lens array 23 and vertical collection lens 25 may be integrated into a single lens structure. Reflector lens 31 has a back surface facing emitters 13 which is anti-reflection coated, and a front output surface on which a partial reflector 33 is coated. The partial reflector 33 may be formed in a pattern that doubles as a spatial filter, as explained below with respect to FIG. 21.

Figure 4:
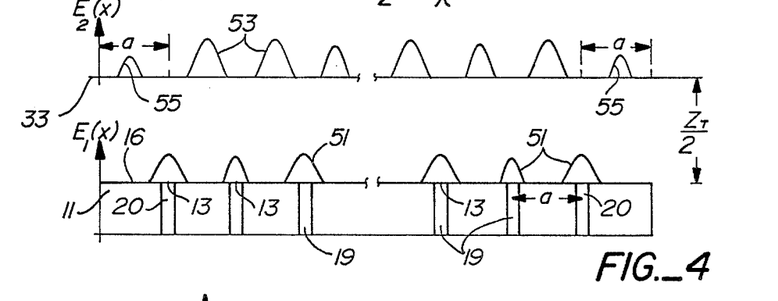
FIGS. 4 and 5 are graphs of array field amplitude versus lateral position for Talbot cavity lasers of the prior art.
Figure 5:
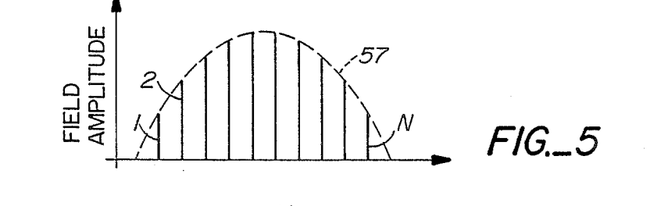

A slab 27 of transparent material, such as glass, is disposed between collection lens 25 and reflector lens 31. Reflective coatings on lateral sides slab 27 form side mirrors 29 and 30. Referring to FIGS. and 5, the Talbot cavity model assumes that there is an infinite array of emitters. If, however, the array 11 is composed of a finite number of emitters 13, the emitter pattern will not be well produced at the reflector 33, half a Talbot distance $Z_T/2 = a^2/\lambda$, or a multiple thereof, away from the emitters, nor will the feedback into the array waveguides 19 be uniform. Again, "a" represents the separation between adjacent emitters and λ represents the wavelength of emitted light in the space between the emitters 13 and partial Talbot reflector 33. In FIG. 4, the field amplitude $E_1(x)$ of emitted light versus lateral position at the emitting plane 16 is represented by curves 51. If the amplitude of each emitter 3 were equal, as shown in FIG. 4, the resulting diffraction pattern $E_2(x)$ at one-half the Talbot distance $Z_T/2$ would be represented by the curves 53. The pattern of emitters 13 is not well reproduced at the ends 55 where the images are weakened and distorted. Further, upon reflection the feedback into the outer waveguides 20 of the array 11 will be weaker than in the center. An analysis of this situation provides a steady state solution in which the array mode field amplitudes for N emitters is approximately:

$$u = \frac{\sin[l\nu\pi/(N+1)]}{\sin[\pi/(N+1)]},$$

where the waveguides 19 are numbered in order $l = 1, \ldots, N$ and is the array mode index. The field amplitude for the lowest order mode $= 1$ is seen in FIG. 5 and has a sinusoidal envelope 57.

Figure 6:
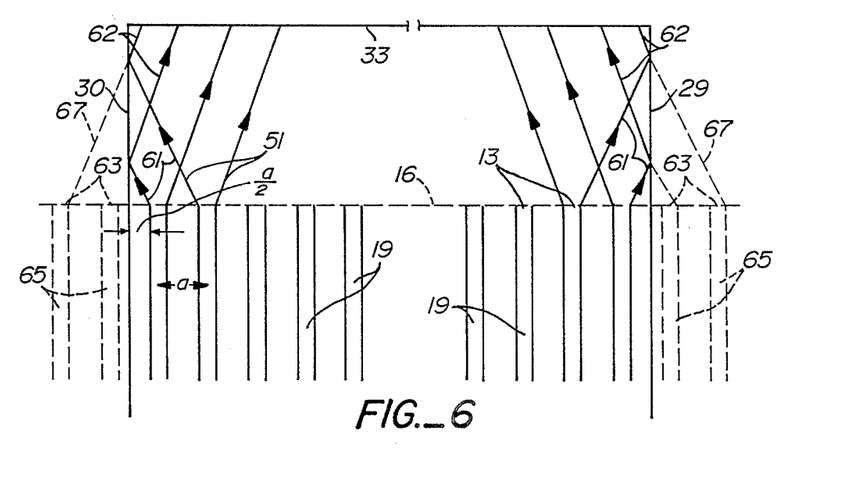
FIG. 6 is a top schematic illustrating the operating principle of the laser in FIG. 1.

The above described problem illustrated in FIGS. 4 and 5 is characteristic of previous Talbot cavity lasers which necessarily have only a finite number of emitters 13. Because the envelope of the modal amplitudes in the waveguides 19 is sinusoidal, the injected charges do not recombine equally across the array and non-uniform gain saturation occurs. This leaves residual gain for higher order modes to achieve threshold. The side mirrors 29 and 30 introduced by the present invention solve this problem. Referring to FIG. 6, light 59 from emitters 13 diverges laterally in both directions, left and right, toward the center of the array and toward an edge of the array. The light 59 interacts with light from neighboring emitters 13, whereby, upon reflection, it couples to waveguides adjacent to that from which it came. However, unlike prior Talbot cavity lasers in which edge emitted edgewise directed optical power was lost, side reflectors 29 and 30 of the present invention redirects this edge directed light 61 back toward the center of the array.

Figure 7:
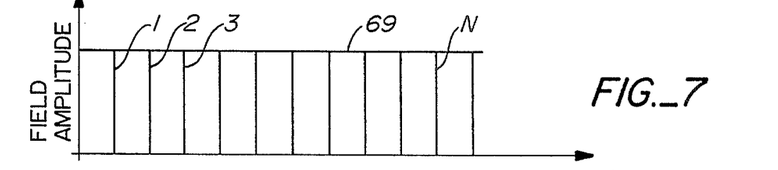
FIG. 7 is a graph of array field amplitude versus lateral position for the laser in FIG. 1.

The effect of this redirection of optical power on the operation of the laser can be found by viewing it as a reimaging of the array by the side mirrors 29 and 30. Mirrors 29 and 30 are positioned a distance a/2 to the right and left of the edgemost emitters 13, i.e. one-half the emitter separation away, and perpendicular to the emitting plane 16. Edgewise directed light 61 is reflected by mirrors 29 and 30, and the reflected light 62 appears to come from emitters 63 beyond the array. It is, thus, like an array of waveguides 19 and 65 which extends to infinity, with emitters 13 and 63 producing light output 59, 61 and 67. While the waveguides 65 and emitters 63 are merely virtual images seen through reflectors 29 and 30, the effect is the same as if they were real. The resulting array mode field amplitudes with respect to lateral position is seen in FIG. 7. The envelope 69 of the modal amplitudes is a constant, thus residual gain is entirely used by the dominant mode.

Figure 10A:
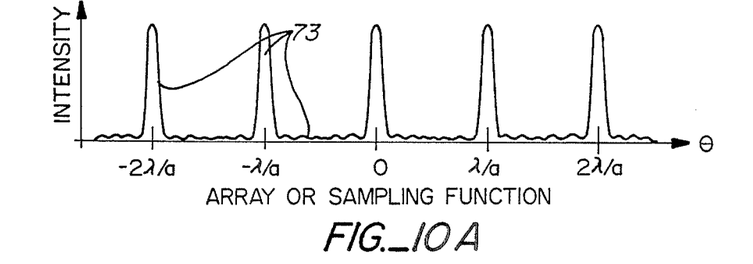
FIGS. 10a–c are graphs of components of far field intensity versus angle for radiation from the laser in FIG. 1.
Figure 10B:
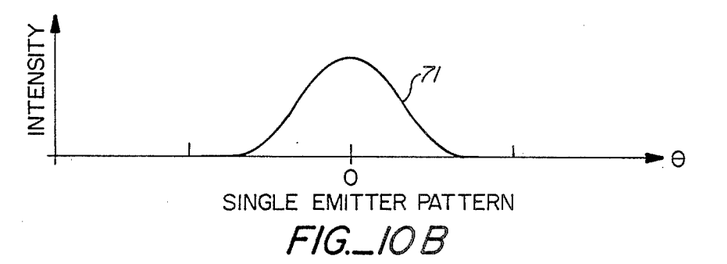
Figure 10C:
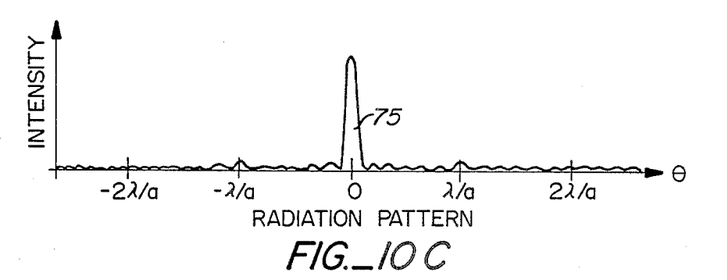
Figure 10D:
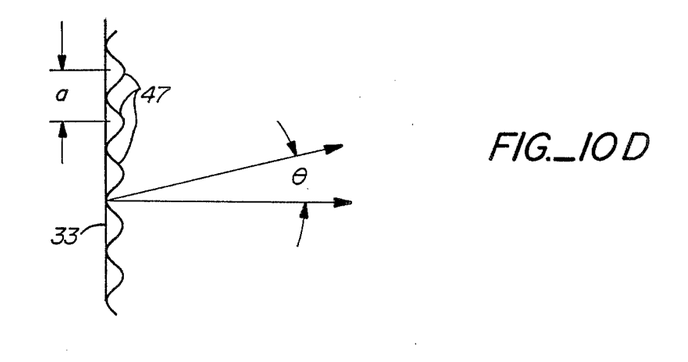

With reference to FIGS. 10a–d, the lateral radiation pattern of the laser in the far field results from the coherent superposition of the N radiators 47 from partial reflector 33. Because the array field amplitude on the Talbot reflector 33 effectively images that on the laser bar emitting plane 16, and is substantially constant, the optical field distribution of each radiator 47 is identical. This means that the far field radiation pattern can be separated into two contributions. A first contribution is the radiation pattern, i.e. Fourier transform, of any one of the identical emitters. This defines the envelope function 71 in FIG. 10b. The second contribution is the Fourier transform of an array of N δ-functions, each of whose strengths is equal to the corresponding complex amplitudes. This defines the array or sampling function 73 in FIG. 10a. The overall far field pattern 75 in FIG. 10c is a product of the two contributions. The array function 73 generally exhibits many distinct lobes spaced approximately λ/a radians apart, each with a FWHM lobe width on the order of λ/aN. For example if λ = 0.83 μm, a = 100 μm and N = 10, then each lobe would have a width of about 0.05° and would be separated from adjacent lobes in the sampling function by 0.48°. For a radiator beam waist of 35 μm at the reflector 33, the envelope function 71 would have a width (FWHM) of 0.25° and has an intensity which is reduced to 10% of its central value at 0.48°. Accordingly, the consequent radiation pattern 75 in FIG. 10c does not have significant side lobes.

Figure 11:
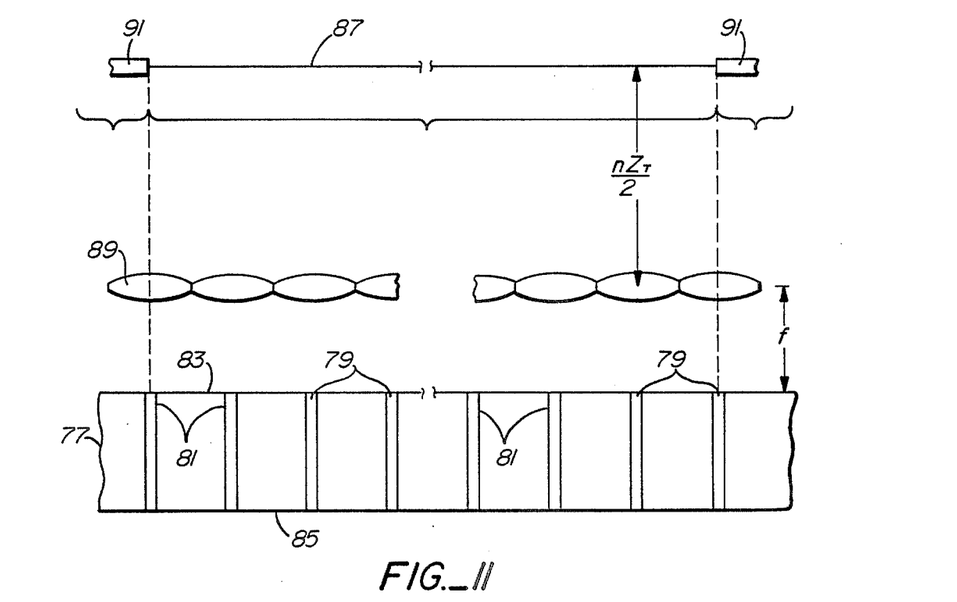
FIG. 11 is a top plan of a second laser embodiment of the present invention.
Figure 12:
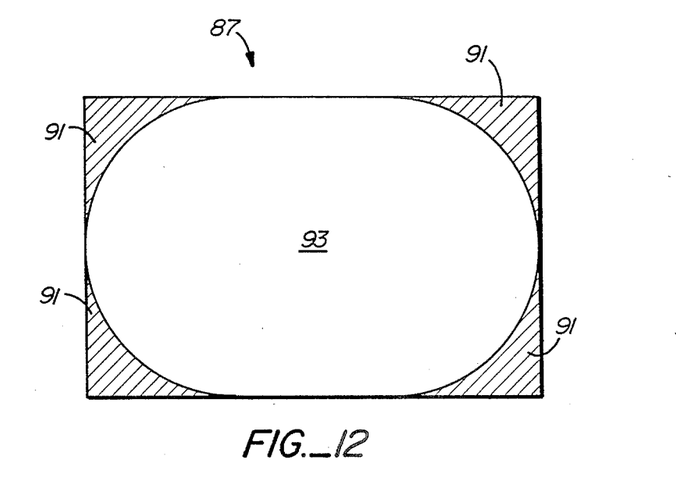
FIG. 12 is a front end view of the laser in FIG. 11, illustrating the reflectivity areas of the Talbot reflector.
Figure 13:
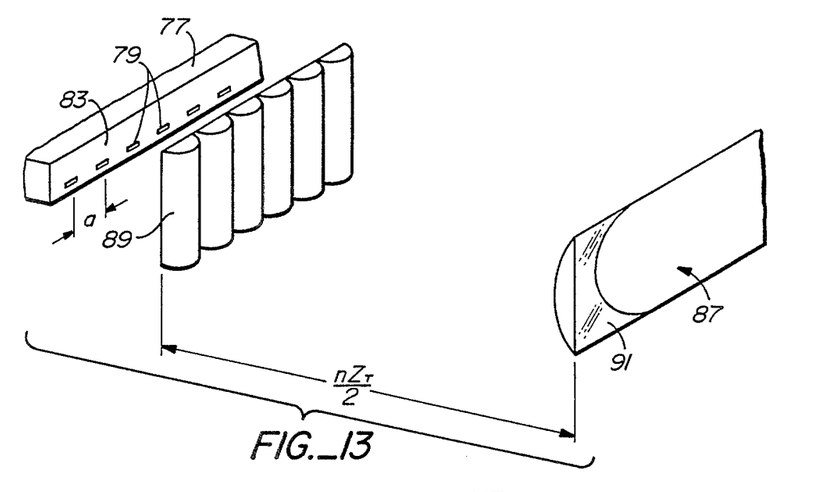
FIG. 13 is a perspective view of the laser in FIG. 11.

With reference to FIGS. 11–13, a second embodiment of the present invention includes a laser bar 77 which is a semiconductor body forming an array of laser light emitters 79. The array of emitters 79 is defined by an active region with a plurality of waveguides 81 in the semiconductor body. The waveguides 81 terminate in a light emitting plane 83, which is one face of the semiconductor body. A pair of reflectors 85 and 87 define a Talbot resonant cavity. Reflector 85 is defined by the back face of the semiconductor body. Talbot reflector 87 is preferably spaced about a distance $nZ_T/2 = na^2/\lambda$ from a phase plane of the emitted light, where $Z_T$ is the Talbot distance, n is a positive integer, a is the substantially equal separation between adjacent emitters 79, $\lambda$ is the wavelength of the emitted light in the space between the phase plane and the reflector 87, and the phase plane is defined by a lateral lenticular array 89. Lenticular array 89 is spaced a focal length f beyond the light emitting plane 83 and the phase plane lies in the plane of the array 89.

Like the first embodiment in FIGS. 1–3, the Talbot cavity of this embodiment includes edge reflectors. However, these edge reflectors 91 are defined by an increase in reflectivity at or toward the edges of the Talbot reflector 87 itself, rather than side mirrors 29 and 30. As seen in FIG. 12, the reflector 87 has a central area 93 of one reflectivity and lateral edge areas 91 of higher reflectivity. Typically, central area 93 will have an average power reflectivity in a range from 15 to 25% and an optical field reflectivity p in a range from about 0.4 to about 0.5. To overcome the optical power loss due to edgewise directed diffraction, the edge areas 91 have an optical field reflectivity $\rho' = \rho(1 + 2\tau)$ where $\rho$ is the central area's field reflectivity and $\tau$ is the strength of nearest neighbor coupling for the dominant mode. Typically, $\tau$ is in a range from 0.05 to 0.15.

Figure 14:
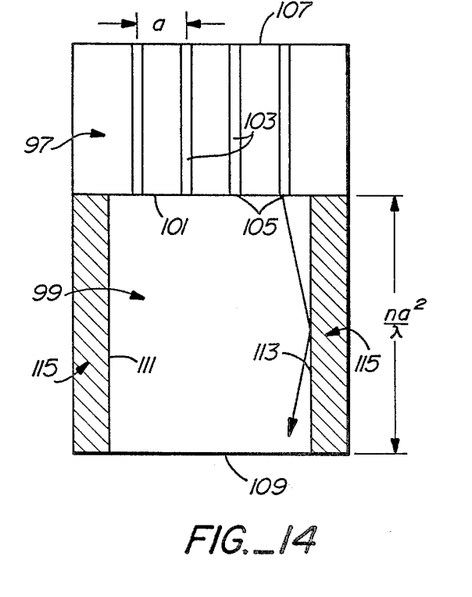
FIGS. 14–16 are, respectively, top, side and front plan views of a third laser embodiment of the present invention.
Figure 15:
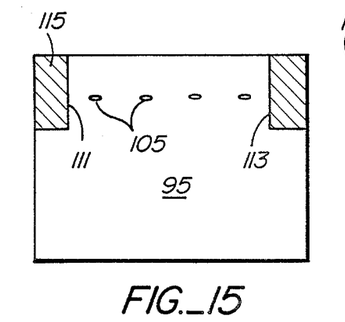
Figure 16:
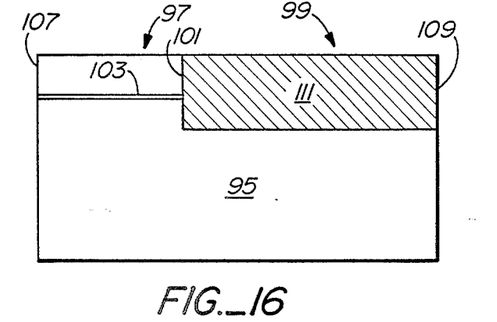

With reference to FIGS. 14–16, a third embodiment of the present invention monolithically integrates a Talbot cavity with side mirrors into a semiconductor body. A semiconductor body 95 has an active region 97, which is electrically pumped to generate light, and a transparent window region 99, which is not pumped but has a wider band gap than the active region so as to be nonabsorptive of the generated light. A planar boundary 101 separates the active region 97 from the window region 99. Active region 97 includes a plurality of waveguides 103 that extend to boundary 101, thereby defining light emitters 105. Window region 99 may include vertical waveguides. Emitters 105 are equally spaced apart by a distance "a", and are substantially identical. A pair of reflectors 107 and 109 are defined by the back and front faces of semiconductor body 95. Front reflector 109, adjacent to window region 99, is spaced a distance $na^2/\lambda$ from boundary 101, where $\lambda$ is the wavelength of light in the window region 99 and n is a positive integer. Thus reflectors 107 and 109 define a Talbot resonant cavity in which emitters 105 reimage on reflector 109. Side mirrors 111 and 113 extend from boundary 101 to front facet 109 and are spaced a distance a/2 outward from the edgemost emitters 105. Side mirrors 111 and 113 are formed by etching away regions 115 in the window region 99 from the semiconductor body 95.

Figure 18:
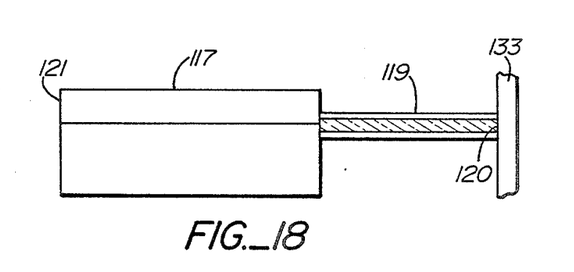
FIGS. 18–20 are, respectively, partial enlarged side, top and front end views of a fifth laser embodiment of the present invention.
Figure 19:
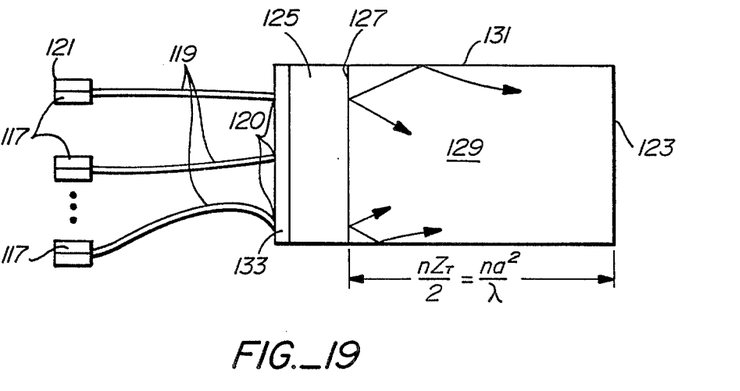
Figure 20:
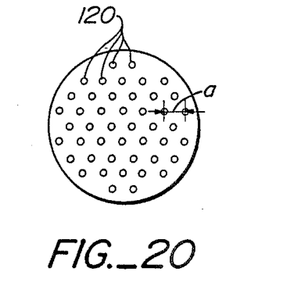

With reference to FIGS. 18–20, another laser diode embodiment of the present invention uses a two-dimensional array of laser emitters in the Talbot cavity instead of a linear array. The laser diode includes a plurality of laser bars or individual diode laser emitters 117 optically coupled to fiber waveguides 119. Typically, waveguides 119 are physically connected at one end to the emitting facets of laser emitters 117 and are bundled together in a hexagonal close packed array at the opposite end. Fibers 119 allow the laser bars or individual diodes 117 to be well separated for better heat removal, while closely spacing the fiber outputs 120 at the opposite end, Preferably, fiber waveguides 119 are polarization preserving single mode fibers. Typically, such fibers have a 5 to 8 micrometer diameter core surrounded by a 125 micrometer diameter cladding. The cladding diameter determines the minimum separation a between nearest neighbors. In a hexagonal close packing, six fiber emitters 120 are 125 micrometers from any given fiber output while another six second nearest neighbors are about 217 micrometers from that fiber output. In square matrix packing, an alternative arrangement to the preferred hexagonal arrangement, four fiber outputs are 125 micrometers from any given fiber output, four second nearest neighbors are about 177 micrometers from that fiber output and four third nearest neighbors are 250 micrometers from that fiber output.

The plurality of laser emitters 117 lie in a Talbot resonant cavity defined by a set of first mirrors 121 and a second Talbot mirror 123. Mirrors 121 are typically defined by the back facets of emitters 117, while Talbot mirror 123 is spaced half the Talbot distance $Z_t/2$ or a multiple thereof from a phase plane 127 of the emitted light. A lens 125 collimates the light from the outputs 120 of waveguides 119 to produce a planar wavefront at lens plane 127. Typically, waveguide outputs 120 are physically coupled to a surface of the lens 125. An antireflection coating 133 covers the lens surface. A transparent slab 129 of cylindrical shape, or alternatively, of polygonal cross-section, occupies the space between phase plane 127 and Talbot mirror 123. As noted above, mirror 123 is a distance $nZ_T/2 = na^2/\lambda$ from plane 127. Here n is a positive integer, a is the separation between nearest neighbors of light outputs 120 as imaged onto phase plane 127 by lens 125. $\lambda$ is the wavelength of the emitted light in the slab material 129 between plane 127 and mirror 123.

In accord with the invention, the slab 129 has an edge surface 131 which is reflectively coated. The edge of lens 125 may also be reflectively coated. Reflective surface 131 reflects the edgewise directed diverging light from the edgemost emitters back toward the center so that the feedback to the edgemost emitters is substantially equal to that of the more central emitters. Alternatively, the reflective surface 131 images the finite array of emitters 120 to infinity, thereby effectively realizing the Talbot cavity model. Each of the emitters radiates at substantially equal amplitude in the dominant mode. Alternatively, the Talbot mirror 123 could have variable reflectivity, as in the embodiment in FIGS. 11–13, with the outer rim areas having higher reflectivity than the central areas to compensate for the power lost from light diverging out the sides.

Figure 21A:
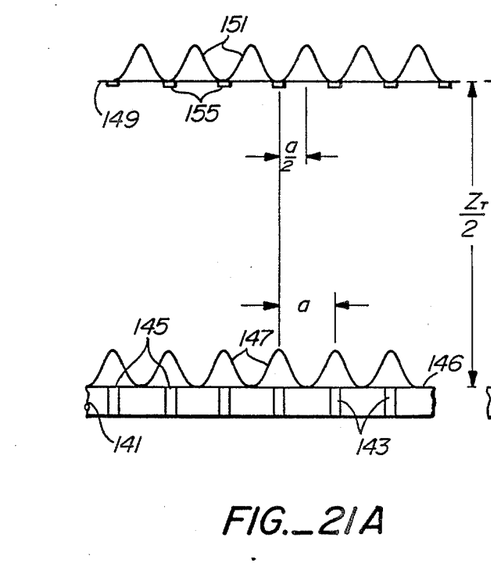
FIGS. 21a–b are graphs of array field amplitude versus lateral position, illustrating the concept of spatial filtering used in any of the embodiments of the present invention.
Figure 21B:
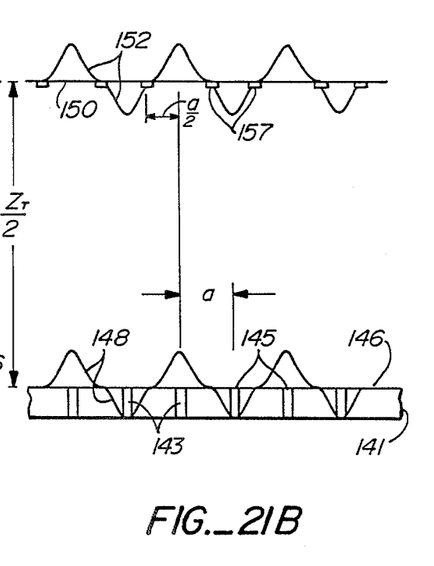

With reference to FIGS. 21a and 21b, in order to further improve the performance of the Talbot cavity lasers described above, spatial filters may be added to the Talbot reflector to increase mode discrimination. To illustrate the effect of a spatial filter on a Talbot cavity laser, a laser bar 141 is shown in both FIGS. 21a and 21b, having a plurality of waveguides 143 defining substantially identical, equally spaced emitters 145 in an emitting plane 146. The field amplitude versus lateral position in the emitting plane 146 is represented by curves 147 and 148 in the two cases. Half a Talbot distance $Z_T/2 = a^2/\lambda$ in front of emitting plane 146 is the Talbot reflector 149 and 150 in the two cases. Again the field amplitude versus lateral position in the reflector plane is represented by curves 151 and 152.

It is a property of Talbot cavities that if the emitters 145 all radiate in phase (corresponding to the lowest order array mode), as seen in FIG. 21a, then the image formed on the reflector 149 will also be in phase, as shown by curves 151, albeit displaced laterally by a/2, where a is the emitter separation. Likewise, if the emitters 145 radiate so that nearest neighbors radiate 180° out of phase (corresponding to the highest order array mode), as seen in FIG. 21b, then the image will also be one of alternating phase, as seen by curve 152, without the lateral displacement. This pattern also holds true at odd multiples of the half Talbot distance $Z_T/2$.

This property can be exploited by placing scatterers, absorbers or deflectors on the Talbot reflector 149 or 150 to discriminate against the unwanted array mode. Alternatively, local areas of increased reflectivity can also be placed on the reflector to discriminate in favor of the desired mode. In FIG. 21a, areas of lower reflectivity, represented by absorbers 155 are placed in positions directly in front of the corresponding emitter positions 145 where the undesired highest order mode, represented by curve 152 in FIG. 21b, would have amplitude peaks. Areas of higher reflectivity are located between filters 155 where the desired lowest order mode has its peaks so as to enhance feedback of that mode. Likewise, in FIG. 21b the highest order mode is favored by placing absorbers 157 or other spatial filters in positions displaced by a/2 from the corresponding emitter positions 145. This type of reflector pattern is also seen in FIG. 1, where the pattern 33 has areas 34 of higher reflectivity displaced by a/2 from corresponding positions of emitters 13, thereby favoring the lowest order mode.

Figure 17:
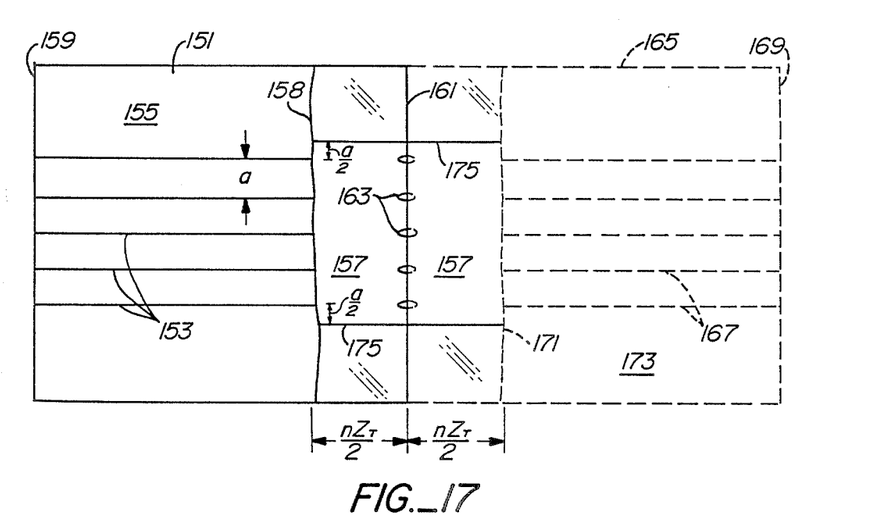
FIG. 17 is a top plan of a fourth laser embodiment of the present invention.

With reference to FIG. 17, a spatial filter can also be placed on integrated Talbot cavity lasers by etching. A semiconductor body 151 has a plurality of waveguides 153 in an active region 155. The waveguides 153 terminate at a planar boundary 158 between active region 155 and a transparent window region 157. Back and front facets 159 and 161 of the semiconductor body 151 serve as reflectors. Facet 161 is spaced a distance of about $nZ_T/2 = na^2/\lambda$ from the boundary 158, where n is a positive integer, a is the waveguide separation and $\lambda$ is the wavelength of emitted light in window region 157. Deflectors 163 are etched into front facet 161 at positions directly in front of waveguides 153. These positions favor the in phase mode which images between the deflectors 163. In an alternative integrated embodiment the semiconductor body 151 is twice as long and includes the portion 165 shown in phantom. Additional waveguides 167 are added that terminate at an alternate mirror facet 169. Facet 169 replaces facet 161 in this alternate embodiment. The waveguides 167 also terminate at a boundary 171 between an active region 173 for waveguides 167 and window region 157, now in the center of the laser. The window region 157 has a length $nZ_T = 2na^2/\lambda$, instead of $nZ_T/2$ from before. Deflectors, scatterers or absorbers 163 are located in the center of window region 157 along plane 161. Side mirrors 175 are etched into window region 157 at a distance of a/2 from the edgemost waveguides.

The lasers described above all improve over prior Talbot cavity lasers by including edge reflectors, in the form of side mirrors or increased edge reflectivity, to maintain substantially equal gain to all the laser emitters in the array.

We claim:

1. A diode laser comprising,
   an array of laser emitters, said emitters being substantially identical and equally spaced apart at a light emitting plane;
   a Talbot resonant cavity, said array of emitters being located within said cavity; and
   edge reflector means associated with said Talbot resonant cavity for increasing feedback of light into edgemost ones of said emitters.

2. The laser of claim 1 wherein a reflector of said resonant cavity is spaced a distance of approximately $na^2/\lambda$ from a phase plane of light emitted from said array, where n is a positive integer, a is the substantially equal spacing between said emitters and $\lambda$ is the wavelength of the light emitted from said array in the region between said phase plane and said reflector.

3. The laser of claim 1 wherein said array is a linear array.

4. The laser of claim 1 wherein said array is a two dimensional array.

5. The laser of claim 1 wherein said edge reflector means comprise side mirrors extending from said array to said reflector and laterally spaced a distance a/2 from said edgemost emitters.

6. The laser of claim 1 wherein said edge reflector means comprises an increase of reflectivity of said reflector toward edges thereof.

7. The laser of claim 1 wherein said Talbot resonant cavity is an external cavity with at least one mirror distinct from a semiconductor body forming said array.

8. The laser of claim 1 wherein said Talbot resonant cavity is integral with a semiconductor body forming said array, said cavity including reflectors defined by facets of said semiconductor body.

9. The laser of claim 1 wherein a reflector of said resonant cavity includes spatial filter means for enhancing feedback of a preferred array mode relative to other array modes.

10. A diode laser comprising,
    a semiconductor body having an active light emitting region with a plurality of waveguides, said waveguides terminating in a light emitting plane, said waveguides being substantially equally spaced apart in said light emitting plane;
    a pair of reflectors, a first one of said reflectors being defined by a back face of said semiconductor body; and
    edge reflector means associated with said pair of reflectors for increasing feedback of emitted light into edgemost ones of said waveguides.

11. The laser of claim 10 wherein a second one of said pair of reflectors is spaced a distance of approximately $na^2/\lambda$ from a phase plane of light emitted from said body, wherein n is a positive integer, a is the separation between waveguides at said light emitting plane and $\lambda$ is the wavelength of emitted light between said phase plane and said second reflector.

12. The laser of claim 10 wherein said light emitting plane is an antireflection coated front face of said semiconductor body.

13. The laser of claim 10 wherein said light emitting plane is a boundary between said active light emitting region of said semiconductor body and a transparent window region of said semiconductor body, said second reflector being defined by a front face of said semiconductor body adjacent to said window region.

14. The laser of claim 10 wherein said phase plane is defined by a lenticular array spaced a focal distance in front of said light emitting plane, said phase plane lying in the plane of said lenticular array.

15. The laser of claim 10 wherein said edge reflector means comprises side mirrors extending from said light emitting plane to said second reflector and spaced a distance a/2 from edgemost waveguides.

16. The laser of claim 10 wherein said edge reflector means comprises an increase in reflectivity of said second reflector toward its edges.

17. The laser of claim 10 wherein said second reflector includes spatial filter means for enhancing feedback of a preferred array mode relative to other array modes.

18. A laser comprising,
a laser bar having a reflective face, and an emitting face with a plurality of substantially identical, equally spaced light emitting elements;
a reflector being spaced from said emitting face by a distance of approximately $na2/\lambda$, where n is a positive integer, a is the spacing between said light emitting elements and $\lambda$ is the wavelength of light emitted by said elements; and
a pair of side mirrors extending from said emitting face to said reflector and spaced a distance a/2 beyond edge emitting elements.

19. The laser of claim 18 further comprising a lenticular array having a plurality of lens elements, one lens element per light emitting element, each lens element being spaced between said emitting face and said reflector a focal length away from a corresponding light emitting element.

20. The laser of claim 18 wherein said reflector has low reflectivity portions opposite from said light emitting elements and higher reflectivity portions between said low reflectivity portions across from areas of said emitting face between said light emitting elements.

21. The laser of claim 18 wherein said pair of side mirrors comprise a reflective material coating on side faces of a transparent slab disposed between said emitting face and said reflector.

22. The laser of claim 18 wherein said laser bar emitting face has an antireflective coating thereon.

23. A laser comprising,
an array of substantially identical, equally spaced laser emitters,
an array of lenses spaced a focal length away from said laser emitters,
a partial reflector located at a distance of approximately $na^2/\lambda$ from the lens array, where "n" is a positive integer, "a" is the center-to-center spacing between the laser emitters and $\lambda$ is the wavelength of light emitted by the laser emitters, said partial reflector having a variable reflectivity with higher reflectivity at lateral edges thereof.

24. A laser comprising,
a semiconductor body having an active light emitting region with a plurality of substantially identical, equally spaced waveguides, and a transparent region bordering said light emitting region, said waveguides terminating at a planar boundary between said light emitting and transparent regions, said semiconductor body also having a pair of reflective end facets, one said end facet being at an end of said transparent region at a distance of about $na^2/\lambda$ from said planar boundary, where "n" is a positive integer, "a" is the spacing between waveguides and $\lambda$ is the wavelength of light in said transparent region; and
vertically oriented reflective side faces defined in said semiconductor body on each lateral edge of said transparent region, said side faces being spaced a distance a/2 from edge waveguides.

25. The laser of claim 24 further comprising a vertical waveguide defined in said transparent region, said vertical waveguide extending from said planar boundary to said one end facet and from side face to side face.

26. A laser comprising,
a plurality of diode lasers, each having a reflective back face and a light emitting front face;
a plurality of light transmissive fibers, each fiber having a first end coupled to a front face of one of said diode lasers, a second end of said fibers terminating in a bundled plane, said second ends being equally spaced; and
a transparent cylinder having a first end coupled to said second ends of said fibers, a second end opposite from the first end with a partially reflective coating thereon, and a highly reflective circumferential surface.

27. The laser of claim 26 wherein said slab is cylindrical with a highly reflective circumferential surface.

* * * * *

UNITED STATES PATENT AND TRADEMARK OFFICE
CERTIFICATE OF CORRECTION

PATENT NO. : 4,972,427

DATED : November 20, 1990

INVENTOR(S) : William Streifer et al.

It is certified that error appears in the above-identified patent and that said Letters Patent is hereby corrected as shown below:

[57] Abstract, line 6, "The phase plne" should read - - The phase plane - -.
[57] Abstract, line 15, "de fined ina single" should read - - defined in a single - -.
[57] Abstract, line 16, "ransparent region" should read - - transparent regions - -.
Column 1, line 10, "singlelobe far field" should read - - single-lobe far field - -.
Column 1, line 62, "inphase array" should read - - in-phase array - -.
Column 4, line 51, "focal length f" should read - - focal length f' - -.
Column 5, line 39, "Referring to Figs. and 5" should read - - Referring to Figs. 4 and 5 - -.
Column 5, line 52, "each emitter 3" should read - - each emitter 13 - -.
Column 5, line 68, "and is the array mode index" should read - - and $\nu$ is the array mode index - -.
Column 6, line 1, "mode = 1" should read - - mode $\nu$ = 1 - -.
Column 8, line 10, "end, Preferably" should read - - end. Preferably - -.

Signed and Sealed this

Twenty-third Day of April, 1991

*Attest:*

HARRY F. MANBECK, JR.

*Attesting Officer*  *Commissioner of Patents and Trademarks*